United States Patent [19]

Miller et al.

[11] 4,106,076
[45] Aug. 8, 1978

[54] CIRCUIT MODULE

[75] Inventors: Robert Miller, Poway; Paul L. Grundy, San Diego, both of Calif.

[73] Assignee: NCR Corporation, Dayton, Ohio

[21] Appl. No.: 704,597

[22] Filed: Jul. 12, 1976

[51] Int. Cl.² ............................................. H05K 7/20
[52] U.S. Cl. .................................. 361/394; 361/379; 361/407; 361/412
[58] Field of Search ............... 361/331, 334, 338, 379, 361/381, 382, 383, 384, 390, 341, 392, 393, 342, 394, 395, 407, 415, 380, 412, 427, 429; 174/16 R, 99 B; 200/307

[56] References Cited
U.S. PATENT DOCUMENTS 3,691,432   9/1972   Edfors ................................. 361/394

*Primary Examiner*—Gerald P. Tolin
*Attorney, Agent, or Firm*—J. T. Cavender; Albert L. Sessler, Jr.

[57] ABSTRACT

A circuit module is disclosed wherein a supporting framework for the module also serves as a voltage and ground bus structure for providing appropriate connections for voltage distribution to circuit boards which are assembled on the framework to form the walls of the module. This facilitates the use completed structure forms a hollow configuration which acts as a plenum chamber to facilitate the cooling of components mounted on the circuit boards. Two different types of supporting frameworks are disclosed. Also disclosed are arrangements for disposing assemblies of circuit modules within cabinets in such a manner as to facilitate ready access thereto.

10 Claims, 10 Drawing Figures

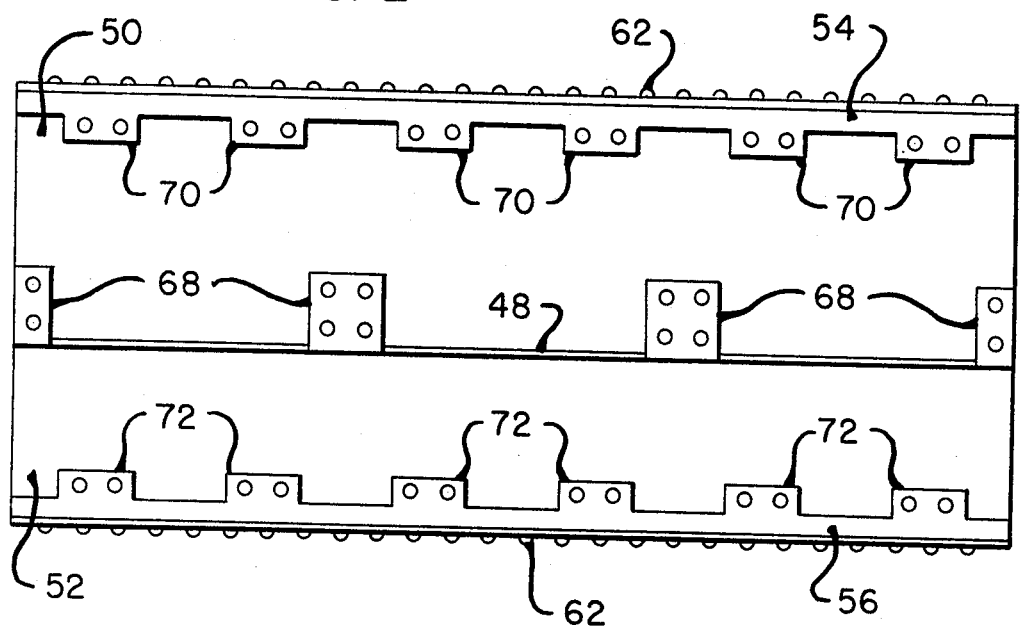
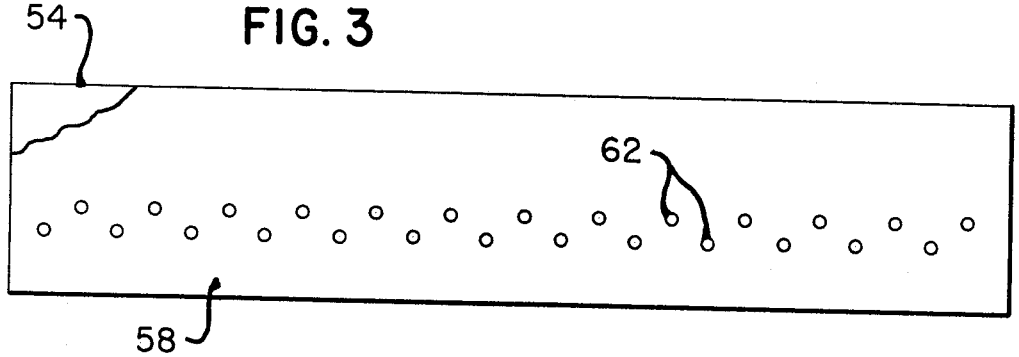
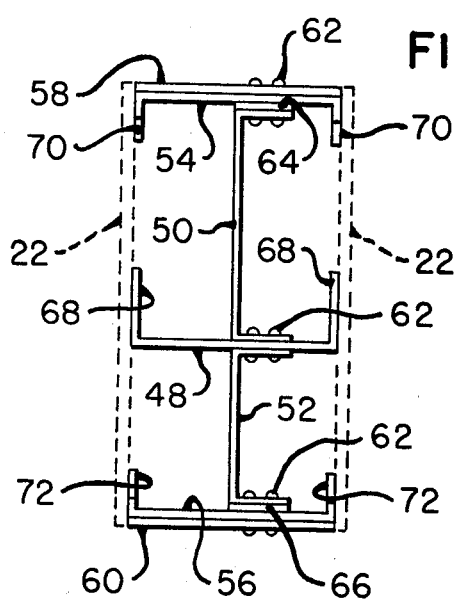
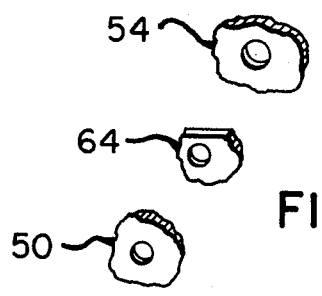

CIRCUIT MODULE

BACKGROUND OF THE INVENTION

The present invention relates generally to circuit modules and more particularly to circuit modules comprising printed circuit boards mounted on supporting framework.

As various types of electronic equipment have evolved through several "generations", commencing with use of thermionic type electrical components, followed by discrete solid state components such as transistors, into integrated circuit components in which an increasingly large number of functions can be included in a single "chip", the requirement for efficient, compact packaging of the components into modules or cabinets has become increasingly important, for a number of reasons. One reason is to take full advantage of the circuit miniaturization permitted by the reduction in component size. Another reason is that the spacing between components increasingly becomes a limiting factor in the speed of operation of the system or device in which they are used as the speed of operation of the components themselves increases. A third reason is that material and labor costs are affected by the size and complexity of the cabinet or housing in which the components are placed, and the ease of interconnection between the components and to the voltage distribution system.

SUMMARY OF THE INVENTION

The purpose of the present invention is to provide a circuit module comprising a multi-purpose frame on which are mounted a plurality of component-carrying elements such as printed circuit boards containing various electronic components. The multi-purpose frame, which may take different forms, serves both as a structural support for the printed circuit boards and as a multiple power bus for distributing the necessary voltages and providing a ground to the printed circuit boards mounted thereon. The circuit boards also serve a dual function in constituting the "skin" or walls of the enclosure, as well as supporting and interconnecting the electronic components of the circuit. The enclosure functions as a plenum chamber to enable the various electronic components on the circuit boards to be kept, by air cooling, at a temperature suitable for their efficient operation. Groups of circuit modules may be connected together and disposed within cabinetry in arrangements which facilitate ready access thereto through access means in the cabinetry.

According to one embodiment of the invention, a circuit module comprises a framework including first and second bus elements having flanges on both sides for connecting printed circuit boards thereto, a central bus element having flanges on both sides thereof for connecting printed circuit boards thereto, a pair of connecting elements connecting one end bus element in spaced relation to each side of said central bus element, and means for electrically isolating the end bus elements from the central bus element; at least one circuit board extending on each side between the end bus elements; and means structurally and electrically connecting each circuit board to the flanges of each end bus element and the central bus element, whereby electrical potential levels on each end bus element and the central bus element are applied to the circuit board through the connecting means.

It is therefore an object of the present invention to provide a circuit module of compact, efficient and inexpensive design.

An additional object is to provide a circuit module having a multi-purpose frame which serves both as a structural support for the mounting of electronic components and as a voltage distributing means for said components.

A further object is to provide a circuit module comprising a frame and a plurality of walls comprised of printed circuit boards.

A further object is to provide a circuit module comprising a frame, air cooling means for cooling circuit components, and a plurality of printed circuit boards on which the components are mounted, secured to the frame to constitute a plenum chamber for the air cooling means.

A further object is to provide an arrangement of one or more pluralities of coupled circuit modules within a cabinet in such a means as to facilitate access to the modules.

With these and other objects, which will become apparent from the following description, in view, the invention includes certain novel features and combinations of parts, a plurality of forms or embodiments of which are hereinafter described with reference to the drawings which accompany and form a part of this specification.

BRIEF DESCRIPTION OF THE DRAWINGS

FIG. 2 is an elevation view of one embodiment of the invention showing the framework fabricated from sheet metal.

FIG. 3 is a plan view of the embodiment of FIG. 2.

FIG. 4 is an end view of the embodiment of FIG. 2.

FIG. 5 is a fragmentary exploded view showing one manner in which electrical isolation is maintained between the elements of the framework shown in FIGS. 2, 3 and 4.

DETAILED DESCRIPTION OF THE PREFERRED EMBODIMENTS

Figure 1:
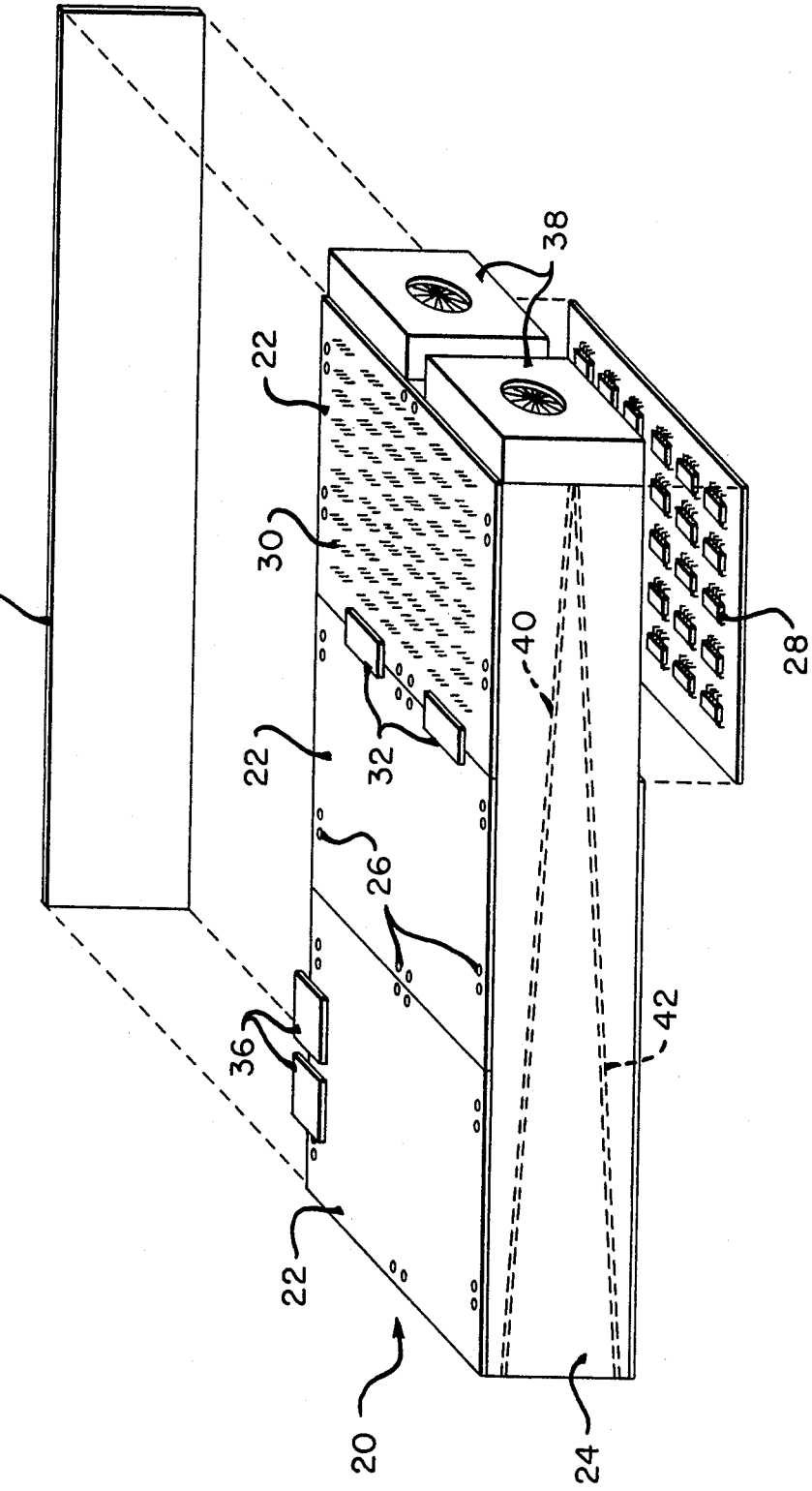
FIG. 1 is a perspective view of a circuit module embodying the present invention.

Referring now to FIG. 1, shown there is a circuit module 20 comprising a plurality of printed circuit boards 22 secured to a framework 24 by suitable connecting means 26 which provide both an electrical and a mechanical connection between the board 22 and the adjacent element of the framework 24. Any suitable means, such as clamps, screws, etc. may be used for connection purposes, with electrical and mechanical connections being established between the circuit board and the framework simultaneously. It will be seen that input-output connections can thus be provided on all edges of the circuit boards. As shown in the projected portion of the view of FIG. 1, a plurality of electronic components 28, which may be, for example, integrated circuit chips, are mounted on the inward-facing sides of the boards 22 by means of their connectors being bonded to pins 30 which protrude through the boards to the outward-facing sides thereof. The protruding ends of the pins 30 may be used for electrical connection purposes and as test points for ascertaining electrical values in connection with testing and maintenance. Electrical connections between adjacent circuit boards may be provided by connectors 32.

Signals to be transmitted between modules 20 may be carried by transfer bus 34, which can take the form of a printed circuit board with the necessary number and configuration of conductors contained thereon. The bus may also take other forms if desired. The bus 34 may be secured to the module in any appropriate manner, and in FIG. 1 is shown as being located against one side of the framework 24, from which it is electrically isolated by a suitable insulating means. Suitable connecting means, such as connectors 36, may be employed to provide the desired electrical connections between the circuit boards 22 and the bus 34.

It will be seen that the assembly of the framework 24 with the circuit boards 22 forms an enclosure, which can serve as a plenum chamber for cooling the electrical components 28 mounted on the circuit boards 22, since these components are mounted on the inside of the enclosure. Fans 38 or other suitable cooling means may be employed for this purpose. In the illustrated embodiment of FIG. 1, a pair of fans 38 is mounted at one end of the enclosure formed by the framework 24 and the circuit boards 22. Two angled planar members 40 and 42 may be disposed in wedge configuration within the enclosure in order to channel the air moved by the fans 38 to exert maximum cooling effect upon the components 28. It may be noted that with this arrangement, the hotter the air passing through the enclosure, the faster the velocity of the air, which tends to produce a self-regulating effect and to maintain the temperature of the components at a relatively constant level.

The framework 24 of the module 20 may be constructed in any suitable manner which enables it to perform the dual function of providing a supporting structure for the circuit boards 22 and of also constituting a plurality of voltage distribution busses whereby a plurality of necessary voltage levels may be carried to the circuit boards 22 without the need of additional cables or complex interconnections.

One form of construction of the framework 24 is shown in FIGS. 2, 3 and 4. As particularly shown in FIG. 4, the framework is built up of a plurality of channel-shaped elements, which can readily be fabricated, for example, from sheet metal. These elements include a central bus element 48, a pair of connecting elements 50, 52 and a pair of end elements 54, 56. The connecting elements 50, 52 are secured by their turned-over portions to either side of the central element 48 with suitable fastening means 62, and the end elements 54, 56 in turn are secured to the other flanges of the connecting elements 50, 52 by fastening means such as 62.

Since any or all of the individual elements 48, 50, 52, 54, and 56 may serve as voltage distributing busses, insulating elements may be placed between busses at their areas of connection for electrical isolation purposes. In FIG. 4, for purpose of example, the connecting elements 50, 52 are shown connected directly to the central bus element 48. If it be assumed that the element 48 is connected to ground, then the elements 50, 52 will also be at ground. Let it also be assumed that the end bus element 54 distributes a potential of $-5$ volts and that the end bus element 56 distributes a potential of $-2$ volts. Under these circumstances it is necessary to interpose a dielectric element 64 between elements 50 and 54, and to interpose a dielectric element 66 between the elements 52 and 56, thus isolating the $-5$ volt and $-2$ volt potentials from ground. This may be seen in FIG. 4 and also in the fragmentary view of FIG. 5, in which fragmentary portions of the ground element 50, the insulating element 64, and the $-5$ volt bus element 54 are shown in exploded relationship. The use of large coincident contact areas between busses, with the dielectric element interposed therebetween, tends to minimize electrical noise in the system. The fastening means 62 are also fabricated from a non-conductive material, at least in those instances in which electrical isolation must be maintained between busses which are mechanically connected.

The desired voltage levels may be applied to the various busses forming the framework of FIGS. 2, 3 and 4 from appropriate power supplies to any suitable connecting means, such as through the fastening means 62, through a bus bar located in superimposed relation to the bus element, or by some other appropriate plug or connector (not shown).

In addition to isolating the bus elements from each other, means must also be provided to electrically insulate the bus elements against external contact, and for this reason, exterior insulating members such as the members 58 and 60 are bonded or otherwise secured to the end bus elements 54 and 56.

Circuit boards 22 may be connected to the framework of FIG. 4 by means of flanges on the bus elements. As shown in dashed lines in FIG. 4, the circuit boards 22 are secured to flanges 68, 70 and 72 on the central bus element 48, the end bus element 54 and the end bus element 56, respectively. These connections, in addition to mechanically securing the circuit boards 22 to the framework, also apply the voltage distributed through the various bus elements to the circuit boards 22.

Figure 6:
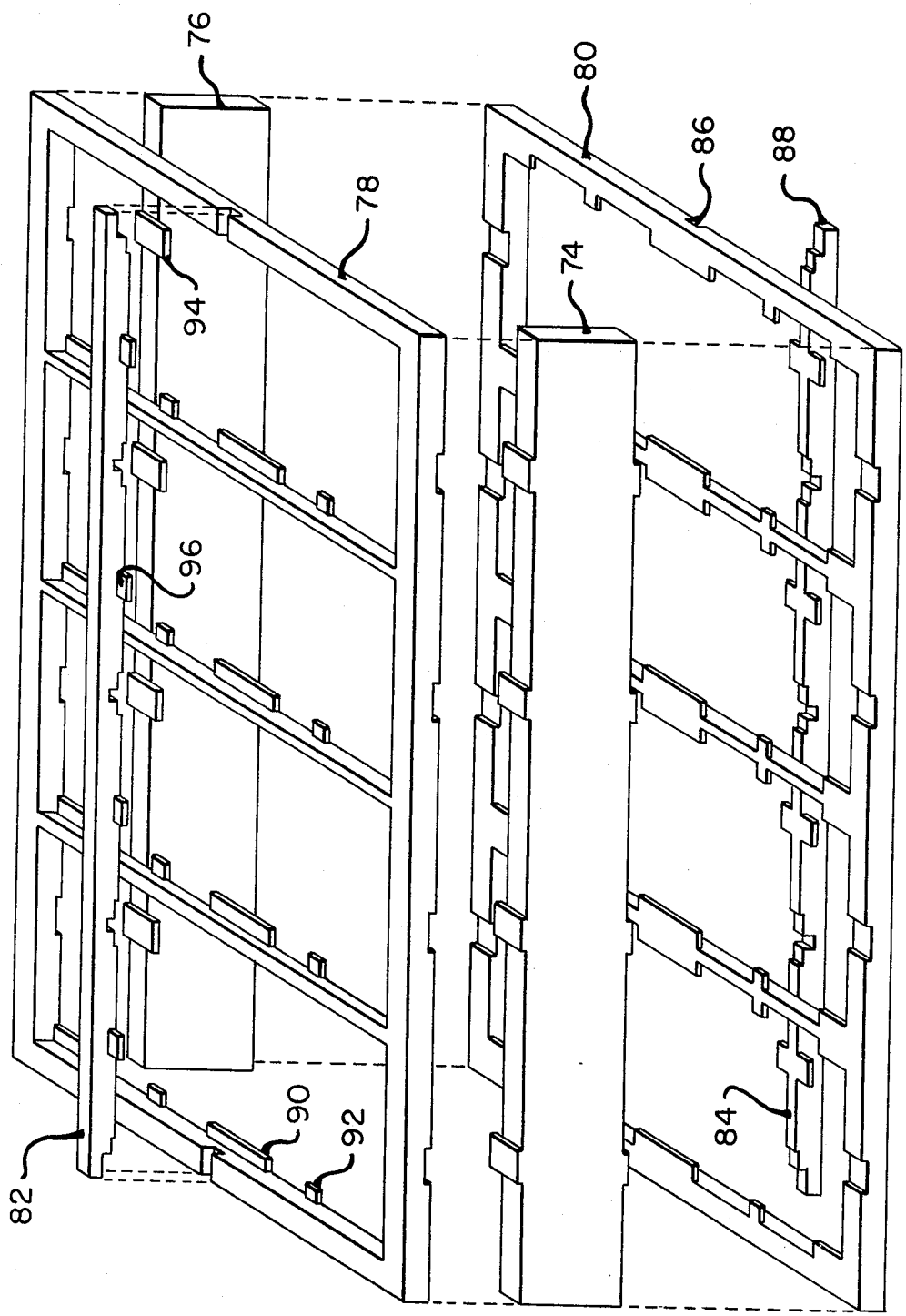
FIG. 6 is a projected view of a second embodiment of the invention showing the framework fabricated from cast elements.

A second form of construction of the framework 24 is shown in exploded perspective view in FIG. 6. In this embodiment, the framework is made up of a plurality of bus elements cast of some suitable material, such as aluminum. Casting of the frame bus elements is economically feasible since variations in cross section of any one piece are not significant enough to cause flow problems during the casting operation.

The elements of the framework of FIG. 6 include two end bus elements 74, 76; two side bus elements 78, 80; and two central elements 82, 84. The various elements include complementary notches and projections, such as notch 86 and projection 88, in order to provide for stronger, more rigid connections between elements, and in order to facilitate assembly of the framework. In those instances in which electrical isolation between bus elements is necessary, suitable dielectric members (not shown) may be interposed. Securing of the various bus elements to each other may be accomplished by any suitable fastening means, such as screws or clamps. Pads such as the pads 90, 92 of the side bus element 78, the pad 94 of the end bus element 74, and the pad 96 of the central element 82 are used to support circuit boards 22 on the framework, and, again, any suitable securing means may be employed to provide a combined mechanical and electrical connection between the circuit board and the bus element.

The desired voltages may be applied to the various busses from appropriate power supplies through any suitable connecting means, in the same manner as indicated for the embodiment of FIGS. 2, 3 and 4.

Figure 7:
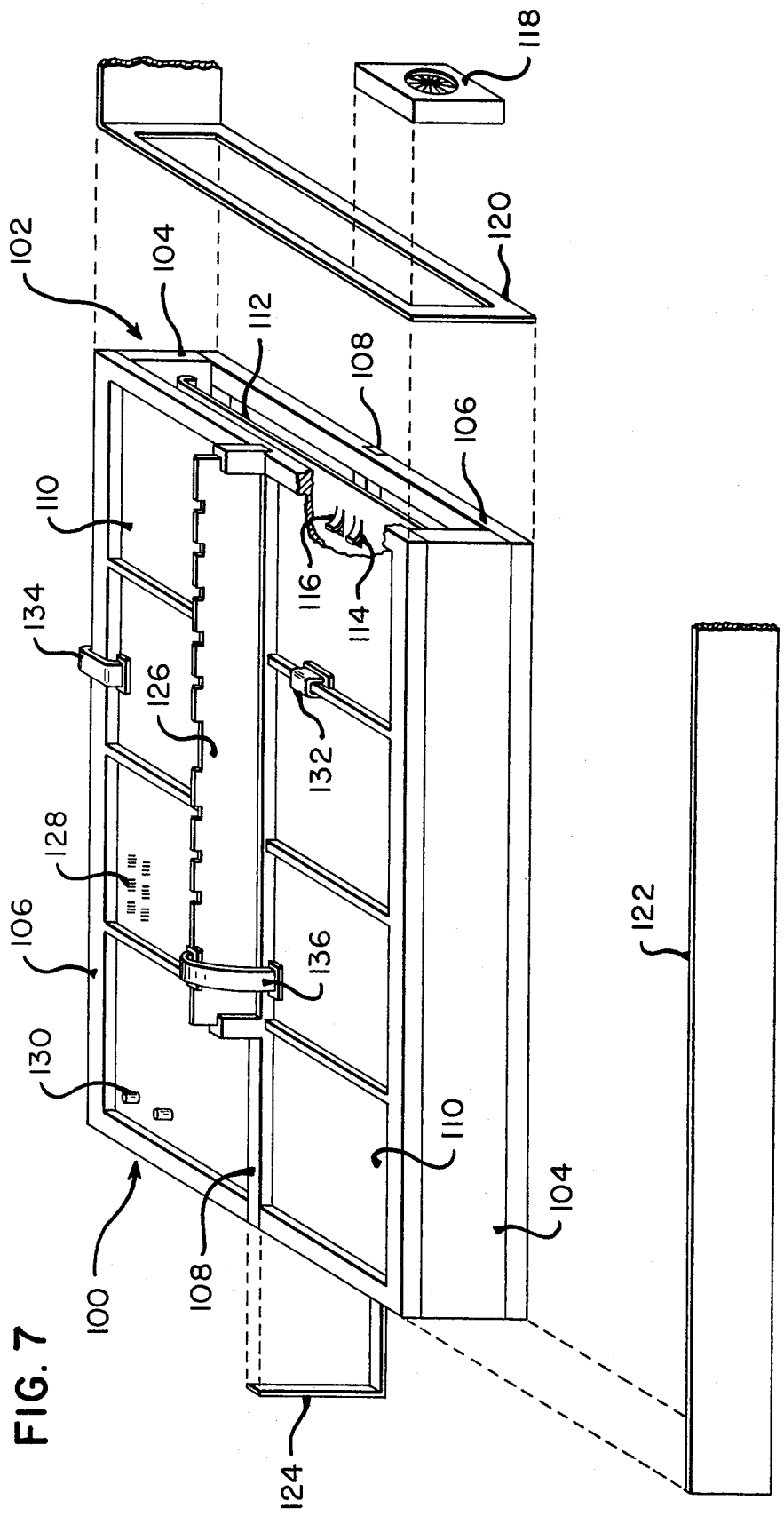
FIG. 7 is a projected view of a circuit module embodying the framework of FIG. 6 with supplemental bus members added thereto.

Shown in FIG. 7 is a circuit module 100 utilizing a cast framework 102 of the type generally shown in FIG. 6, including end bus elements 104, side bus elements 106 and central bus elements 108, with circuit boards 110 assembled thereto.

Positioned within the enclosure formed by the module is a cooling baffle of a somewhat different type than shown in FIG. 1, consisting of a single planar member 112 perforated by a number of openings 114 in which the material struck from the opening is curved to form a vane 116 which deflects air moving through the enclosure against components mounted on the circuit boards 110. The member 112 can also serve a bussing function if desired. As in the embodiment of FIG. 1, a fan 118 performs the function of moving cooling air through the enclosure, and is mounted in a frame 120 which, if desired, may also serve as a ground, or other voltage distribution bus connected to the power supply.

Voltages are also supplied to the individual bus elements of the framework 102 by busses such as a bus 122 connected to one voltage source of the power supply and to one of the end bus elements 104, and a 124 connected to another voltage bus of the power supply and to at least one of the central bus elements 108.

In addition to the above busses, an internal transfer bus 126 is also provided. In the illustrated embodiment, this takes the form of an etched printed circuit board utilizing strip line or micro-strip transmission lines to assure freedom from crosstalk and other electrical noise. It is rigidly secured to one of the central bus elements 108 and becomes an integral part of the circuit module 100. If desired, a second internal transfer bus could be utilized in the circuit module, and could be secured to the other central bus element 108.

Referring now to the circuit boards 110 shown in FIG. 7, it will be noted that pins 128 are shown as extending through the circuit boards 110 from active components mounted on the other side of the board for cooling. Passive components such as components 130 may be mounted on the outside of the board 110 where any necessary cooling can be accomplished by natural convection.

Various electrical connection means are also shown in the embodiment of FIG. 7. Connections to the circuit boards 110 via the connection means may be made in any suitable manner, and are normally made by connection with the circuit component pins such as the pins 128. A first interconnection means 132 is used to connect one printed circuit board to another on the same plane. A second interconnection means 134 is used to connect a printed circuit board on one plane of the circuit module to a second printed circuit board on another plane of the circuit module. A third interconnection means 136 is used to connect a specified location on the internal transfer bus 126 to a printed circuit board 110. Each of these three types of interconnection means may be of standard length and configuration for use wherever needed in the circuit module, thus reducing the need for a wide variety of lengths and types of interconnection means.

Figure 8:
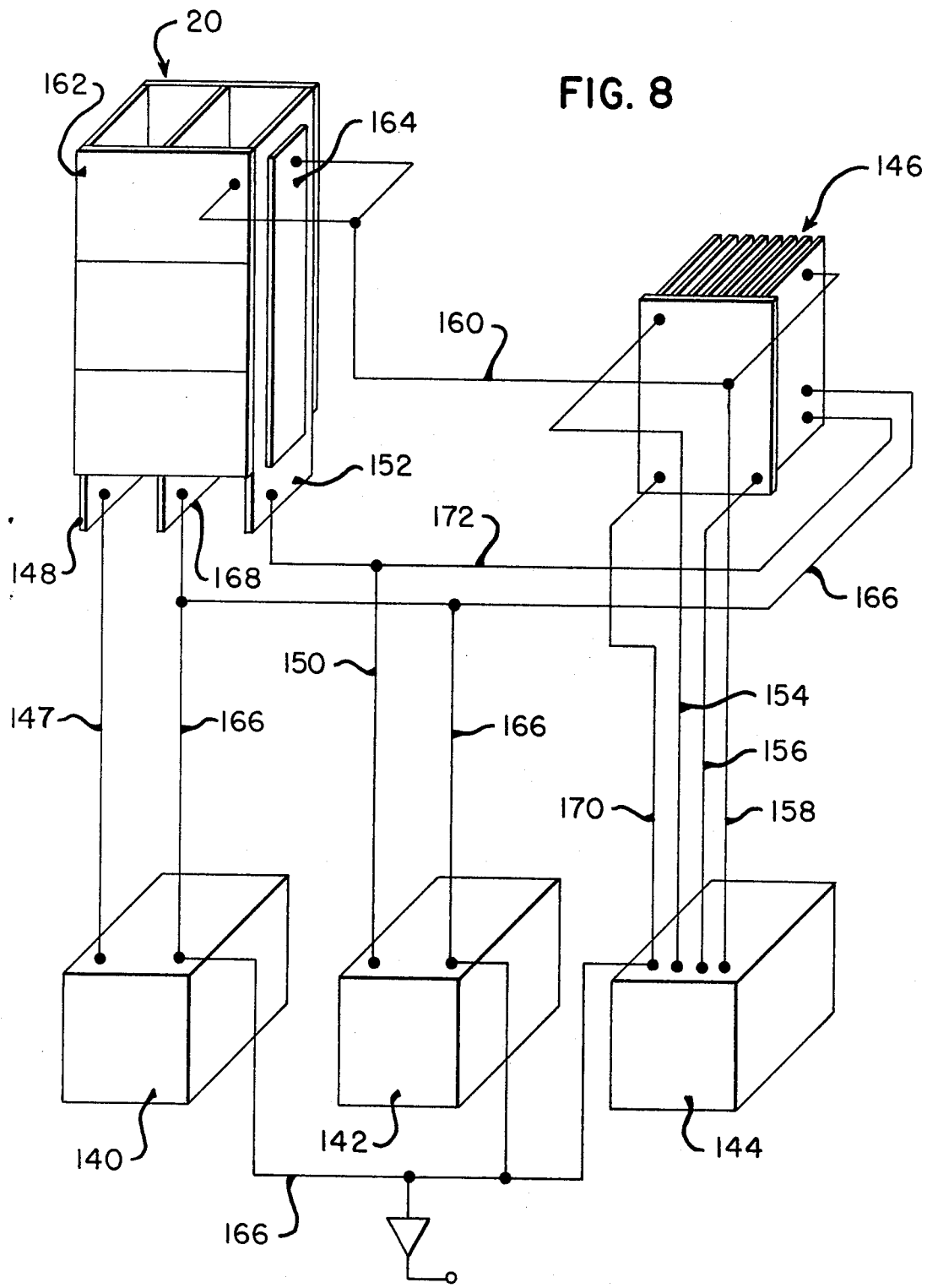
FIG. 8 is a diagrammatic view showing connections between various power supplies, the busses of a circuit module, and a memory module.

Referring now to FIG. 8, the diagrammatic showing represents one possible arrangement in which various bus elements of a circuit module 20 can be connected to selected power supply voltage levels taken from power supplies 140, 142 and 144, with the power supplies also being interconnected to another system module, in this case a memory module 146. Purely for purpose of example, the power supply 140 may supply a potential level of −3.5 volts; the power supply 142 may supply a potential level of −2.0 volts; and the power supply 144 may supply a plurality of potential levels of +12 volts, +5 volts and −5.2 volts.

The connections from the power supplies to the circuit module 20 of FIG. 8 may be accomplished either by large rigid stationary cables or busses, or by smaller flexible cables. For example, if desired, rigid busses such as the elements 122 and 124 shown in FIG. 7 may be employed for such purposes. Normally, heavy rigid cables or buses will be employed to carry high amperages to the circuit module while small flexible cables will carry relatively lower amperages to the modules.

As shown in FIG. 8, the −3.5 voltage source of the power supply 142 is connected by a bus 147 to an end bus element 148 of the circuit module 20. A −2.0 voltage source of the power supply 144 is connected by a bus 150 to an end bus element 152 of the circuit module 20. The +12, +5 and −5.2 voltage levels of the power supply 144 are shown to be connected to the memory module 146 by busses 154, 156 and 158 from the power supply 144. In addition, a further connection 160 extends from the bus 158 to a circuit board 162 and an internal transfer bus 164 of the circuit module 20. A common ground 166 may be connected to all three power supplies and to the central bus element 168 of the module 20. In addition, the ground 166 may be connected over a further connector 170 to the memory module 146. A common ground is thus supplied for both the electrical ground and the logic ground, the latter being provided over the connector 170. It may also be noted that the bus 150 is connected over a further connector 172 to the memory module 146.

Figure 9:
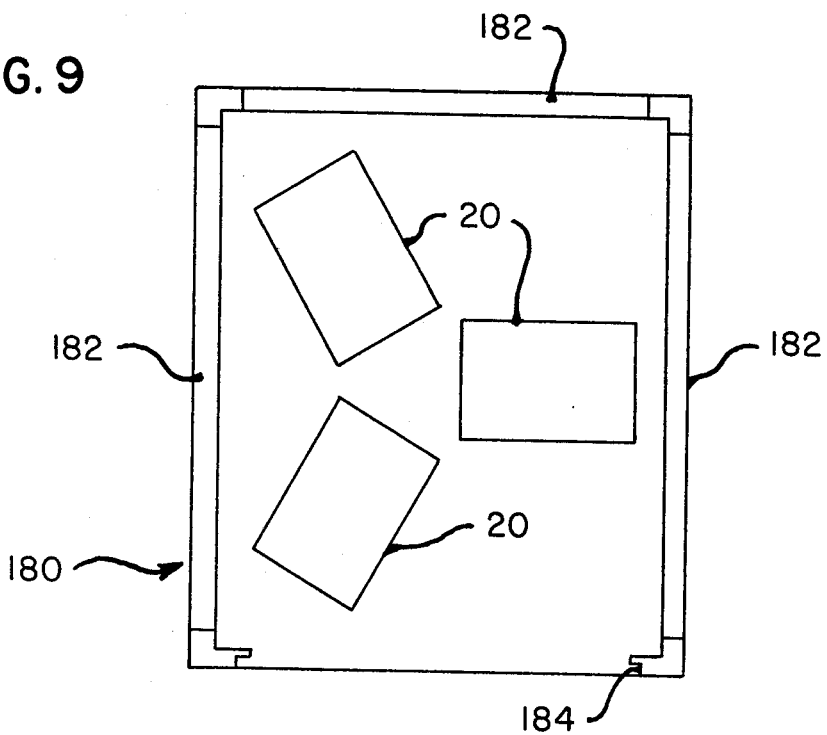
FIG. 9 is a diagrammatic view showing an arrangement of a plurality of circuit modules within a cabinet.

FIG. 9 shows one arrangement by which a plurality of circuit modules 20 can be disposed adjacent to each other within a cabinet 180 to provide a high degree of efficiency in space utilization and ease of access to the modules for maintenance purposes. It will be noted that the three modules 20 are disposed in an angular relationship of approximately 120° between adjacent modules. If desired, other groupings of modules, such as a group of four, could be employed. The cabinet 180 is provided with either access doors 182 or apertures 184, or a combination thereof. The modules 20 are arranged within the cabinet in such a manner that access may be obtained to any two of the modules simultaneously by going through either the aperture 184 or one of the access doors 182.

Figure 10:
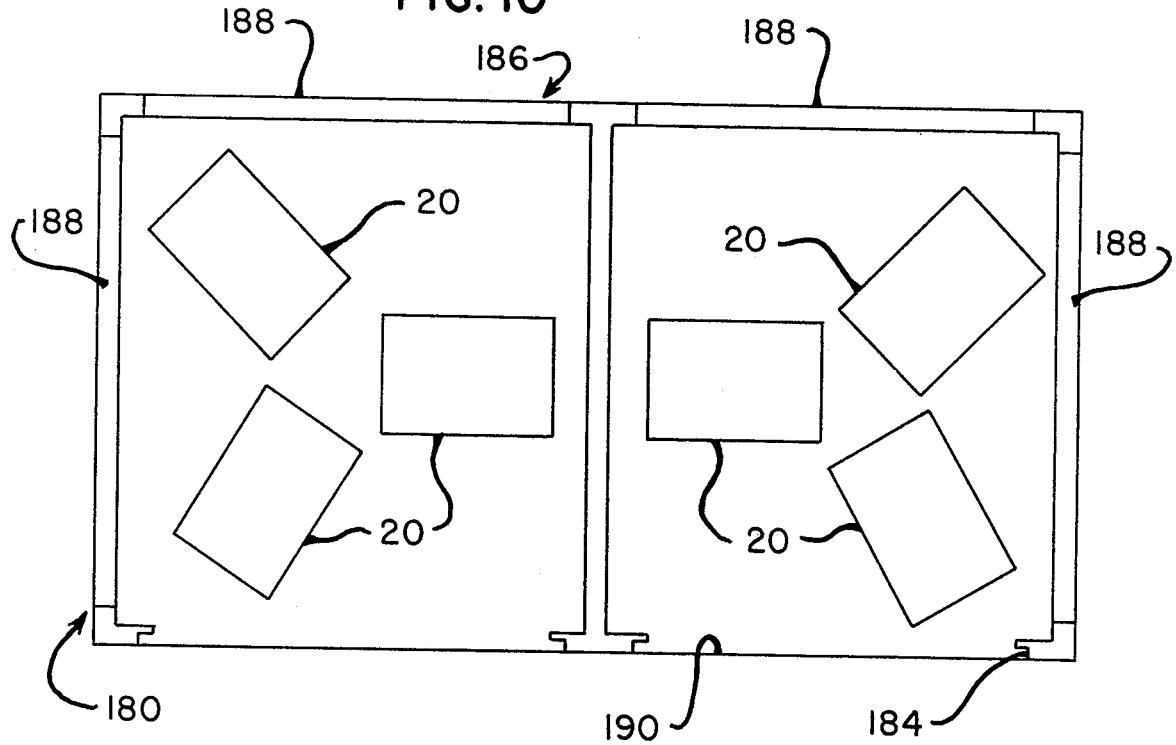
FIG. 10 is a diagrammatic view showing an arrangement of two groups of circuit modules within a cabinet.

FIG. 10 shows a second arrangement in which two groups of modules 20 are enclosed in a two part cabinet 186. Essentially this arrangement is a doubling of the arrangement shown in FIG. 9, in which one wall of the cabinet 180 is a common wall of the two part cabinet 186. The modules 20 are shown to be disposed in groups of three, one in each of the two sub-cabinets of the cabinet 186, with each group of modules 20 being arranged so that there is an angle of approximately 120 degrees between adjacent modules. If desired, other groupings of modules, such as a group of four, could be employed. It will be seen that access to the modules either through an access door 188 or an aperture 190, or a combination thereof, in the two parts of the cabinet 186 will provide access to two of the modules simultaneously, thus facilitating maintenance on the modules.

While the forms of the invention illustrated and described herein are particularly adapted to fulfill the objects aforesaid, it is to be understood that other and further modifications within the scope of the following claims may be made without departing from the spirit of the invention.

What is claimed is:

1. A circuit module comprising
a framework including first and second end bus elements having flanges on both sides for connecting printed circuit boards thereto, a central bus element having flanges on both sides thereof for connecting printed circuit boards thereto, a pair of connecting elements connecting one end bus element in spaced relation to each side of said central bus element, and means for electrically isolating the end bus elements from the central bus element;
at least one circuit board extending on each side between the end bus elements; and
means structurally and electrically connecting each circuit board to the flanges of each end bus element and the central bus element,
whereby electrical potential levels on each end bus element and the central bus element are applied to the circuit board through the connecting means.

2. The circuit module of claim 1 in which the assembly of the framework and the circuit boards forms a plenum chamber, and also including cooling means for moving air through the plenum chamber for cooling purposes.

3. The circuit module of claim 2 in which electrical components are mounted on the sides of said circuit boards facing into the plenum chamber to facilitate their cooling by the cooling means.

4. The circuit module of claim 3, in which connector pins associated with said components extend from the sides of the circuit boards facing away from the plenum chamber.

5. The circuit module of claim 4, also including a transfer bus having a plurality of individual signal conductors positioned in electrical contact with selected ones of said component pins for transmission of electrical signals.

6. A circuit module comprising
a framework including first and second end bus elements having means on both sides for connecting printed circuit boards thereto, first and second side bus elements secured to the end bus elements and having means for connecting printed circuit boards thereto, and means for electrically isolating the end bus elements from the first and second side bus elements;
at least one circuit board extending on each side between the end bus elements; and
means structurally and electrically connecting each circuit board to at least one of the end bus elements and one of the side bus elements,
whereby electrical potential levels on the end bus elements and the side bus elements are applied to the circuit boards.

7. The circuit module of claim 6 in which the assembly of the framework and the circuit boards forms a plenum chamber, and also including cooling means for moving air through the plenum chamber for cooling purposes.

8. The circuit module of claim 7 in which electrical components are mounted on the sides of the circuit boards facing into the plenum chamber to facilitate their cooling by the cooling means.

9. The circuit module of claim 8 in which connector pins associated with said components extend from the sides of the circuit boards facing away from the plenum chamber.

10. The circuit module of claim 6, also including an additional bus positioned across at least one of the side bus elements to provide a further electrical connecting means for the associated circuit board.

* * * * *

UNITED STATES PATENT OFFICE
CERTIFICATE OF CORRECTION

Patent No. __4,106,076__   Dated __August 8, 1978__

Inventor(s) __Robert Miller and Paul L. Grundy__

It is certified that error appears in the above-identified patent and that said Letters Patent are hereby corrected as shown below:

Page 1, in the Title, delete "CIRCUIT MODULE" and substitute
--ELECTRICAL COMPONENT AND BUS ELEMENT ASSEMBLY--.

Page 1, under "References Cited" add:

| | | | |
|---|---|---|---|
| --3,560,799 | 2/1971  | Bochicchio     | 361/407 |
| 3,725,843   | 4/1973  | Johnson        | 361/407 |
| 2,927,249   | 3/1960  | Jones          | 361/379 |
| 3,621,339   | 11/1971 | Hodgson        | 361/379 |
| 3,771,293   | 11/1973 | Vest           | 361/384 |
| 3,491,267   | 1/1970  | Goshorn        | 361/407 |
| 3,662,225   | 5/1972  | Carter et al.  | 361/412 |
| 3,900,712   | 8/1975  | Fukao          | 200/307 |
| 3,833,840   | 9/1974  | Sinden         | 361/394 |
| 3,434,014   | 3,1969  | Taynton        | 361/412--. |

Signed and Sealed this

Twenty-second Day of May 1979

[SEAL]

Attest:

RUTH C. MASON
Attesting Officer

DONALD W. BANNER
Commissioner of Patents and Trademarks